United States Patent
Ma et al.

(10) Patent No.: US 11,664,440 B2
(45) Date of Patent: *May 30, 2023

(54) FIELD-EFFECT TRANSISTOR AND FABRICATION METHOD OF FIELD-EFFECT TRANSISTOR

(71) Applicant: HUAWEI TECHNOLOGIES CO., LTD., Guangdong (CN)

(72) Inventors: Xiaolong Ma, Shanghai (CN); Riqing Zhang, Shanghai (CN); Stephane Badel, Leuven (BE)

(73) Assignee: HUAWEI TECHNOLOGIES CO., LTD., Guangdong (CN)

(*) Notice: Subject to any disclaimer, the term of this patent is extended or adjusted under 35 U.S.C. 154(b) by 6 days.

This patent is subject to a terminal disclaimer.

(21) Appl. No.: 17/352,161

(22) Filed: Jun. 18, 2021

(65) Prior Publication Data
US 2021/0313451 A1    Oct. 7, 2021

Related U.S. Application Data

(63) Continuation of application No. 16/417,544, filed on May 20, 2019, now Pat. No. 11,043,575, which is a (Continued)

(30) Foreign Application Priority Data

Nov. 21, 2016    (CN) .......................... 201611022835.2

(51) Int. Cl.
*H01L 29/423*    (2006.01)
*H01L 29/66*    (2006.01)
(Continued)

(52) U.S. Cl.
CPC ........ *H01L 29/66545* (2013.01); *B82Y 10/00* (2013.01); *H01L 29/0653* (2013.01);
(Continued)

(58) Field of Classification Search
CPC .......... H01L 29/66545; H01L 29/0653; H01L 29/7613; H01L 29/66469; H01L 29/0673;
(Continued)

(56) References Cited

U.S. PATENT DOCUMENTS 7,648,883 B2    1/2010 Park
8,384,069 B2    2/2013 Pernel et al.
(Continued)

FOREIGN PATENT DOCUMENTS

CN    1702843 A    11/2005
CN    101197405 A    6/2008
(Continued)

OTHER PUBLICATIONS

S. G. Hur et al., "A practical Si nanowire technology with nanowire—on-insulator structure for beyond 10nm logic technologies," 2013 IEEE International Electron Devices Meeting, Washington, DC, 2013, 4 pages.
(Continued)

*Primary Examiner* — Vu A Vu
(74) *Attorney, Agent, or Firm* — Womble Bond Dickinson (US) LLP

(57) ABSTRACT

An embodiment of the invention provides a fabrication method of a field-effect transistor. The method includes: forming a support structure with a superlattice feature on a semiconductor substrate, where the support structure includes a first semiconductor material layer and a second semiconductor material layer that are alternately disposed, and an isolation layer is disposed on two sides of the support structure; forming, along a boundary between the isolation layer and the support structure, a dummy gate structure that covers the support structure, where a length of the dummy gate structure in a gate length direction is less than the first semiconductor material layer; removing, along the gate
(Continued)

length direction, an area other than a sacrificial layer in the first semiconductor material layer to form an insulation groove; and forming a source and a drain in a preset source drain area along the gate length direction.

19 Claims, 13 Drawing Sheets

Related U.S. Application Data continuation of application No. PCT/CN2017/088086, filed on Jun. 13, 2017.

(51) Int. Cl.
    *H01L 29/78*     (2006.01)
    *H01L 29/06*     (2006.01)
    *B82Y 10/00*     (2011.01)
    *H01L 29/76*     (2006.01)

(52) U.S. Cl.
    CPC .... *H01L 29/0673* (2013.01); *H01L 29/42392* (2013.01); *H01L 29/66469* (2013.01); *H01L 29/66787* (2013.01); *H01L 29/7613* (2013.01); *H01L 29/785* (2013.01)

(58) Field of Classification Search
    CPC ......... H01L 29/42392; H01L 29/66787; H01L 29/785; H01L 29/775; H01L 29/78696; H01L 29/66742; H01L 29/78684; H01L 29/78; B82Y 10/00
    USPC .......................................................... 257/401
    See application file for complete search history.

(56) References Cited

U.S. PATENT DOCUMENTS

| | | | |
|---|---|---|---|
| 8,753,942 B2 | 6/2014 | Kuhn et al. | |
| 9,064,944 B2* | 6/2015 | Kim | H01L 29/785 |
| 9,184,269 B2 | 11/2015 | Ching et al. | |
| 9,219,064 B2* | 12/2015 | Kim | H01L 21/823857 |
| 9,281,378 B2* | 3/2016 | Ching | H01L 29/66795 |
| 9,362,355 B1* | 6/2016 | Cheng | H01L 29/66439 |
| 9,748,404 B1* | 8/2017 | Chang | H01L 29/66772 |
| 9,997,519 B1* | 6/2018 | Bao | H01L 27/092 |
| 10,074,575 B1* | 9/2018 | Guillorn | H01L 21/823821 |
| 10,700,064 B1* | 6/2020 | Zhang | H01L 29/78 |
| 10,734,286 B1* | 8/2020 | Ando | H01L 29/0673 |
| 10,957,601 B2* | 3/2021 | Bi | H01L 21/02647 |
| 10,998,234 B2* | 5/2021 | Xie | H01L 29/66439 |
| 11,043,575 B2* | 6/2021 | Ma | H01L 29/7613 |
| 2008/0076216 A1 | 3/2008 | Pae et al. | |
| 2014/0001441 A1 | 1/2014 | Kim et al. | |
| 2015/0069328 A1 | 3/2015 | Leobandung | |
| 2015/0162447 A1 | 6/2015 | Lee et al. | |
| 2015/0372111 A1* | 12/2015 | Koh | H01L 29/66575 257/29 |
| 2016/0056236 A1 | 2/2016 | Ching et al. | |
| 2016/0111337 A1 | 4/2016 | Hatcher et al. | |
| 2016/0111495 A1 | 4/2016 | Brand et al. | |
| 2016/0211322 A1 | 7/2016 | Kim et al. | |
| 2017/0207404 A1 | 7/2017 | Cao et al. | |

FOREIGN PATENT DOCUMENTS

| | | |
|---|---|---|
| CN | 103311297 A | 9/2013 |
| CN | 103730502 A | 4/2014 |
| CN | 104137265 A | 11/2014 |
| CN | 106024890 A | 10/2016 |
| CN | 106784001 A | 5/2017 |

OTHER PUBLICATIONS

S. Bangsaruntip et al, Density scaling with gate-all-around silicon nanowire MOSFETs for the 10 nm node and beyond. 2013 IEEE, 4 pages.

Kelin J_ Kuhn, Considerations for Ultimate CMOS Scaling. IEEE Transactions on Electron Devices, vol. 59, No. 7, Jul. 2012, 16 pages.

Isaac Lauer et al, Si Nanowire CMOS Fabricated with Minimal Deviation from RMG FinFET Technology Showing Record Performance. 2015 Symposium on VLSI Technology Digest of Technical Papers, 2 pages.

H. Mertens et al, Gate-All-Around MOSFETs based on Vertically Stacked Horizontal Si Nanowires in a Replacement Metal Gate Process on Bulk Si Substrates. 2016 Symposium on VLSI Technology Digest of Technical Papers, 2 pages.

Poortmans J et al: "Theoretical calculation and experimental evidence of the real and apparent bandgap narrowing due to heavy doping in p-type Si and strained Si"1"-"xGe"x layers", Solid State Electronics, Elsevier Science Publishers, Barking, GB, vol. 36, No. 12, Dec. 1, 1993, pp. 1763-1771, XP025749016, 9 pages.

* cited by examiner

FIELD-EFFECT TRANSISTOR AND FABRICATION METHOD OF FIELD-EFFECT TRANSISTOR

CROSS-REFERENCE TO RELATED APPLICATIONS

This application is a continuation of U.S. patent application Ser. No. 16/417,544, filed on May 20, 2019, which is a continuation of International Application No. PCT/CN2017/088086, filed on Jun. 13, 2017. The International Application claims priority to Chinese Patent Application No. 201611022835.2, filed on Nov. 21, 2016. All of the aforementioned patent applications are hereby incorporated by reference in their entireties.

TECHNICAL FIELD

Embodiments of the present invention relate to the field of semiconductor technologies, and in particular, to a field-effect transistor and a fabrication method of a field-effect transistor.

BACKGROUND

Currently, when a field-effect transistor (FET) is fabricated, in an example of a MOSFET (Metal-Oxide Semiconductor Field-Effect Transistor), as shown in FIG. 1, generally, a first semiconductor material layer 11 and a second semiconductor material layer 12 are alternately stacked in a channel 100, a dummy gate structure 13 is located on the second semiconductor material layer 12, and a source 14 and a drain 15 are formed in a source drain area on two sides of the channel 100 by using a doping process. Then, the second semiconductor material layer 12 and the dummy gate structure 13 may be removed by using an etching process. Further, as shown in FIG. 2, locations of the first semiconductor material layer 11 and the dummy gate structure 13 are filled with a gate material by using an RMG (replacement metal gate) process, for example, a high dielectric constant (High-K) material, to form a real gate 21.

In the foregoing fabrication method, when the source 14 and the drain 15 are formed by using the doping process, as shown in FIG. 1, the source 14 (or the drain 15) is in direct contact with the first semiconductor material layer 11 and the second semiconductor material layer 12 in the channel 100. Consequently, some impurity atoms diffuse into the second semiconductor material layer 12 and the first semiconductor material layer 11 to form an extension area 22. As a result, a parasitic parameter such as a parasitic capacitance of a subsequently formed MOSFET is increased, and a GIDL (gate-induced drain leakage) of the MOSFET is also increased, severely affecting performance and reliability of the MOSFET.

SUMMARY

Embodiments of the present invention provide a field-effect transistor and a fabrication method of a field-effect transistor, to reduce a parasitic parameter of a field-effect transistor, thereby improving performance and reliability of the field-effect transistor.

The following technical solutions are used in the embodiments of the present invention to achieve the foregoing objective.

According to a first aspect, an embodiment of the present invention provides a fabrication method of a field-effect transistor, including: forming a fin support structure with a superlattice feature on a semiconductor substrate, where the support structure includes a first semiconductor material layer and a second semiconductor material layer that are alternately disposed, and an isolation layer is disposed on two sides of the support structure; forming, along a boundary between the isolation layer and the support structure, a dummy gate structure that covers the support structure, where a length of the dummy gate structure in a gate length direction (the gate length direction is used to indicate a transport direction of a carrier in the field-effect transistor) is less than a length of the first semiconductor material layer in the gate length direction; removing, along the gate length direction, an area other than a sacrificial layer in the first semiconductor material layer to form an insulation groove, where the sacrificial layer is a projection area of the dummy gate structure in the first semiconductor material layer along a target direction (to be specific, a direction perpendicular to a bottom of the semiconductor substrate), and a dielectric constant of a dielectric filled in the insulation groove is less than a dielectric constant of the first semiconductor material layer; and forming a source and a drain in a preset source drain area along the gate length direction, where the source and the drain are isolated from the sacrificial layer through the insulation groove. In this way, after the sacrificial layer is subsequently removed, a gate material (to be specific, a material with a relatively high dielectric constant) filled at a location of the sacrificial layer can also be isolated from the source and the drain through the insulation groove, to reduce a parasitic parameter such as a parasitic capacitance formed when the source and the drain are in direct contact with the gate material, thereby improving performance and reliability of the field-effect transistor.

In one embodiment, the removing, along the gate length direction, an area other than a sacrificial layer in the first semiconductor material layer to form an insulation groove includes: performing, along the gate length direction, a selective oxidation process on the first semiconductor material layer, so that the area other than the sacrificial layer in the first semiconductor material layer is oxidized to form the insulation groove, where the dielectric filled in the insulation groove is an oxide of the first semiconductor material layer, and the oxide usually has a relatively low dielectric constant. Therefore, the insulation groove can isolate the subsequently formed source (or drain) from a high-K (high dielectric constant) dielectric material filled in the sacrificial layer, to avoid a parasitic capacitance generated after the source (or the drain) is in direct contact with the high-K dielectric material.

In one embodiment, the removing, along the gate length direction, an area other than a sacrificial layer in the first semiconductor material layer to form an insulation groove includes: performing, along the gate length direction, a selective etching process on the first semiconductor material layer, so that the area other than the sacrificial layer in the first semiconductor material layer is removed to form the insulation groove. In this case, the dielectric filled in the insulation groove is air with a relatively low dielectric constant. Therefore, the insulation groove can isolate the subsequently formed source (or drain) from the high-K dielectric material filled in the sacrificial layer, to avoid a parasitic capacitance generated after the source (or the drain) is in direct contact with the high-K dielectric material.

In one embodiment, after the insulation groove is formed, the method further includes: filling the insulation groove with a dielectric material whose dielectric constant is less than 3.9. In this case, the insulation groove is filled with the dielectric material whose dielectric constant is less than 3.9, to be specific, filled with a low-K dielectric material. Therefore, the insulation groove can isolate the subsequently formed source (or drain) from the high-K dielectric material filled in the sacrificial layer, to avoid a parasitic capacitance generated after the source (or the drain) is in direct contact with the high-K dielectric material.

In one embodiment, before the filling the insulation groove with a dielectric material whose dielectric constant is less than 3.9, the method further includes: forming, along the gate length direction, an etching stop layer on a surface of the insulation groove by using an atomic layer deposition (ALD) process. In this way, when the sacrificial layer is subsequently removed, the etching stop layer can prevent an etching solution from etching an area other than the sacrificial layer.

In one embodiment, after the forming a source and a drain in a preset source drain area along the gate length direction, the method further includes: removing the dummy gate structure and the sacrificial layer; and adjusting a thickness of the second semiconductor material layer along a gate structure cross-sectional direction, where the gate structure cross-sectional direction is perpendicular to the gate length direction. Because a channel effect of the field-effect transistor is related to the thickness of the second semiconductor material layer, the channel effect of the field-effect transistor can be alleviated by adjusting the thickness of the second semiconductor material layer, to flexibly adjust the channel effect.

In one embodiment, the adjusting a thickness of the second semiconductor material layer includes: reducing the thickness of the second semiconductor material layer from 8 nm to 4 nm by using an etching process.

In one embodiment, after the adjusting a thickness of the second semiconductor material layer along a gate structure cross-sectional direction, the method further includes: forming a gate at locations of the removed dummy gate structure and the removed sacrificial layer by using an RMG process.

In one embodiment, the forming a support structure with a superlattice feature on a semiconductor substrate includes: growing a periodic superlattice structure including the first semiconductor material layer and the second semiconductor material layer that are alternately disposed on the semiconductor substrate, where a thickness of the first semiconductor material layer and the thickness of the second semiconductor material layer are both less than 50 nm; and etching the superlattice structure to form the fin support structure.

In one embodiment, the forming, along a boundary between the isolation layer and the support structure, a dummy gate structure that covers the support structure includes: forming an oxide layer on the exposed support structure; and forming, on the oxide layer, the dummy gate structure that covers the support structure.

In one embodiment, a length of the dummy gate structure in the gate structure cross-sectional direction is less than a length of the isolation layer; and after the dummy gate structure that covers the support structure is formed on the isolation layer, the method further includes: depositing an insulation layer on a periphery of the dummy gate structure, where a side wall of the insulation layer is flush with a side wall of the isolation layer.

According to a second aspect, an embodiment of the present invention provides a field-effect transistor, including a source and a drain. A gate is disposed in a channel between the source and the drain, the gate is isolated from the source and the drain through an insulation groove, a dielectric constant of a dielectric filled in the insulation groove is less than a dielectric constant of a first semiconductor material layer, and the first semiconductor material layer is a superlattice material film formed when the field-effect transistor is fabricated.

These aspects or other aspects of the present invention are more concise and understandable in the description of the following embodiments.

DESCRIPTION OF EMBODIMENTS

The following describes in detail the technical solutions in the embodiments of the present invention with reference to the accompanying drawings in the embodiments of the present invention. Apparently, the described embodiments are merely some but not all of the embodiments of the present invention.

The embodiments of the present invention provide a field-effect transistor. The field-effect transistor may be a MOSFET such as a stacked gate-all-around nanowire transistor or a fin field-effect transistor (FinFET), or may be a tunneling field-effect transistor (TFET) or the like. This is not limited in the embodiments of the present invention.

Figure 1:
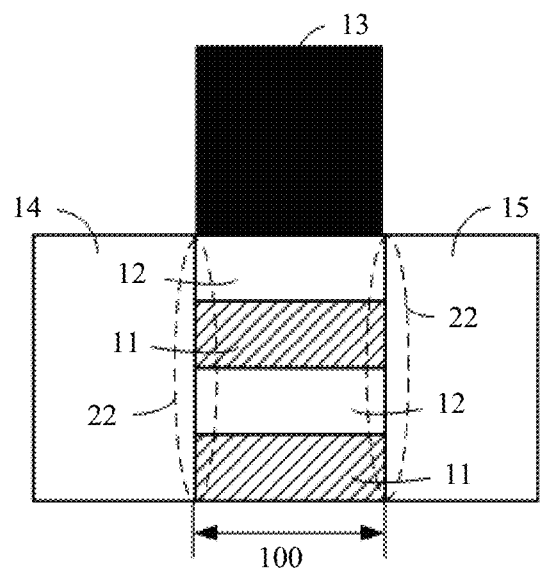
FIG. 1 is a schematic diagram 1 of a fabrication principle of a field-effect transistor in the prior art.
Figure 2:
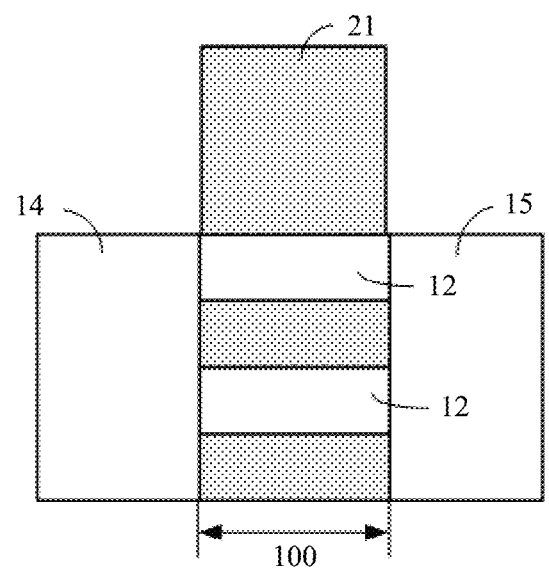
FIG. 2 is a schematic diagram 2 of a fabrication principle of a field-effect transistor in the prior art.
Figure 3:
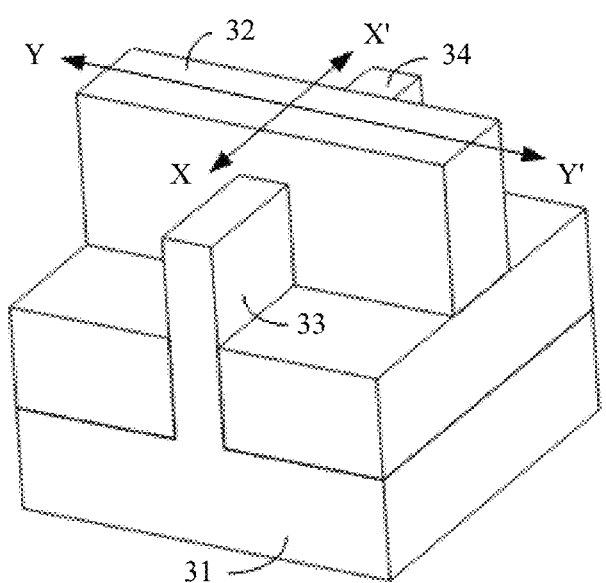
FIG. 3 is a schematic structural diagram of a field-effect transistor according to an embodiment of the present invention.

In addition, the embodiments of the present invention provide a field-effect transistor and a fabrication method of a field-effect transistor. For ease of description, cross-sectional directions of the field-effect transistor are first explained. FIG. 3 is a schematic structural diagram of a field-effect transistor according to an embodiment of the present invention. A gate 32 is disposed on a semiconductor substrate 31, a source drain area is located on two sides of the gate 32, and a fin source 33 and a fin drain 34 are respectively disposed on the two sides of the gate 32. In this case, an XX' direction is used to indicate a gate length direction of the field-effect transistor, to be specific, a transport direction of a carrier in the field-effect transistor; a YY' direction is used to indicate a gate structure cross-sectional direction of the field-effect transistor, where the gate length direction and the gate structure cross-sectional direction are perpendicular to each other.

It should be noted that FIG. 3 shows merely a structure including a group of the gate 32, the source 33, and the drain 34 in the field-effect transistor. It can be understood that the field-effect transistor may further include a plurality of groups of gates, sources, and drains that have similar structures as the foregoing gate, source, and drain. This is not limited in this embodiment of the present invention.

Figure 4:
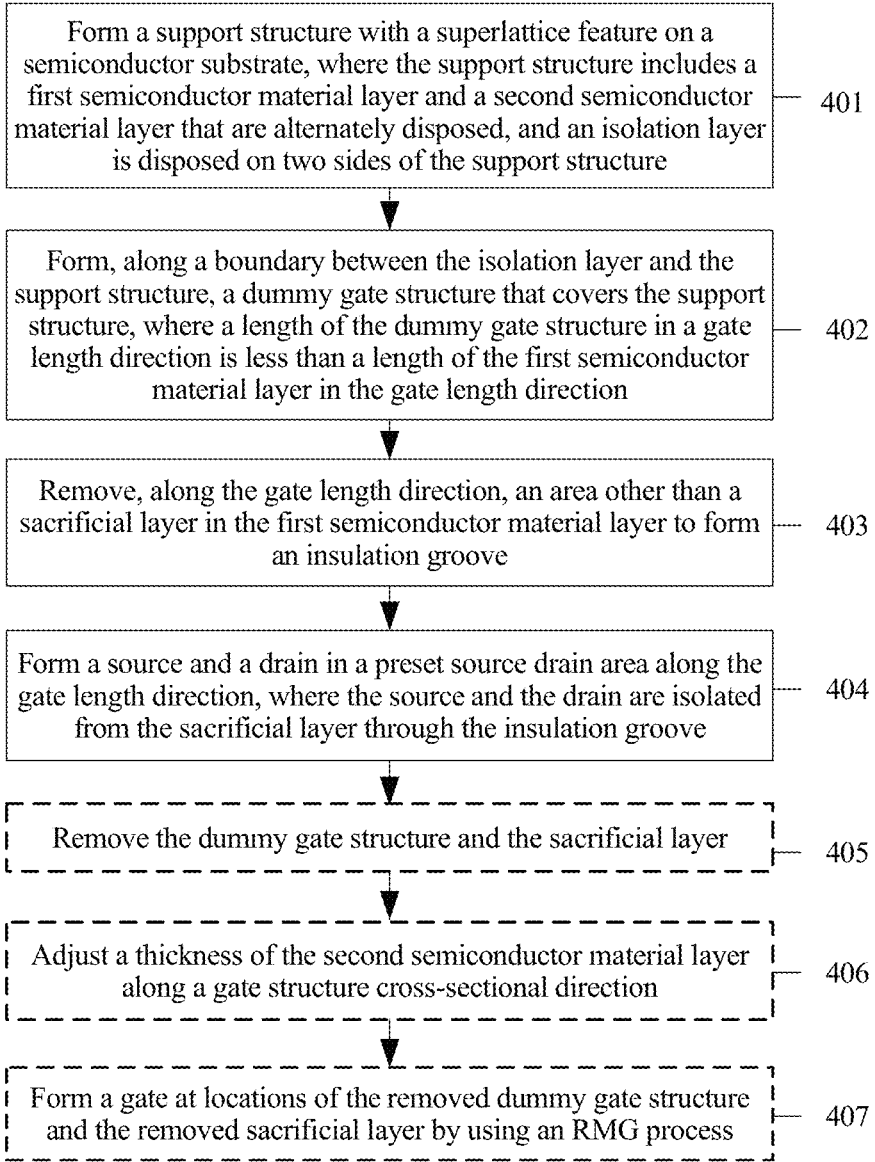
FIG. 4 is a schematic flowchart of a fabrication method of a field-effect transistor according to an embodiment of the present invention.

Based on the gate length direction and the gate structure cross-sectional direction shown in FIG. 3, an embodiment of the present invention provides a fabrication method of a field-effect transistor. As shown in FIG. 4, the method includes the following steps.

Block 401. Form a support structure with a superlattice feature on a semiconductor substrate, where the support structure includes a first semiconductor material layer and a second semiconductor material layer that are alternately disposed, and an isolation layer is disposed on two sides of the support structure.

The semiconductor substrate may be an SOI (silicon-on-insulator) substrate, a bulk silicon substrate, an ETSOI (extremely thin SOI) substrate, an SGOI (SiGe-on-insulator) substrate, an III-V-OI (III-V-on-insulator) substrate, or the like. This is not limited in this embodiment of the present invention.

Figure 5:
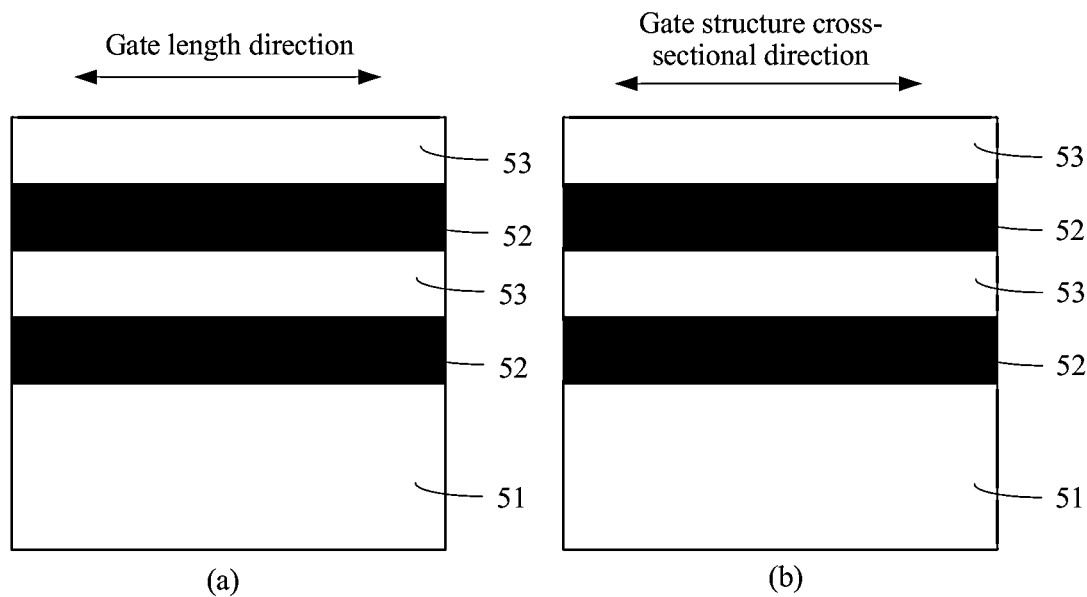
FIG. 5 is a schematic diagram 1 of a fabrication principle of a field-effect transistor according to an embodiment of the present invention.

Specifically, as shown in FIG. 5 (FIG. 5 (a) is a schematic cross-sectional view along a gate length direction, and FIG. 5 (b) is a schematic cross-sectional view along a gate structure cross-sectional direction), a periodic superlattice (superlattice) structure including a first semiconductor material layer 52 and a second semiconductor material layer 53 that are alternately disposed may be first grown on a semiconductor substrate 51. The superlattice structure is a strictly periodic multi-layer film that includes two different types of elements that are alternately stacked in forms of thin layers whose thicknesses range from several nanometers to tens of nanometers.

For example, a thickness of the first semiconductor material layer 52 and a thickness of the second semiconductor material layer 53 may be both less than 50 nm. When the first semiconductor material layer 52 is made of a silicon material, the second semiconductor material layer 53 may be made of a silicon germanium material.

Figure 6:
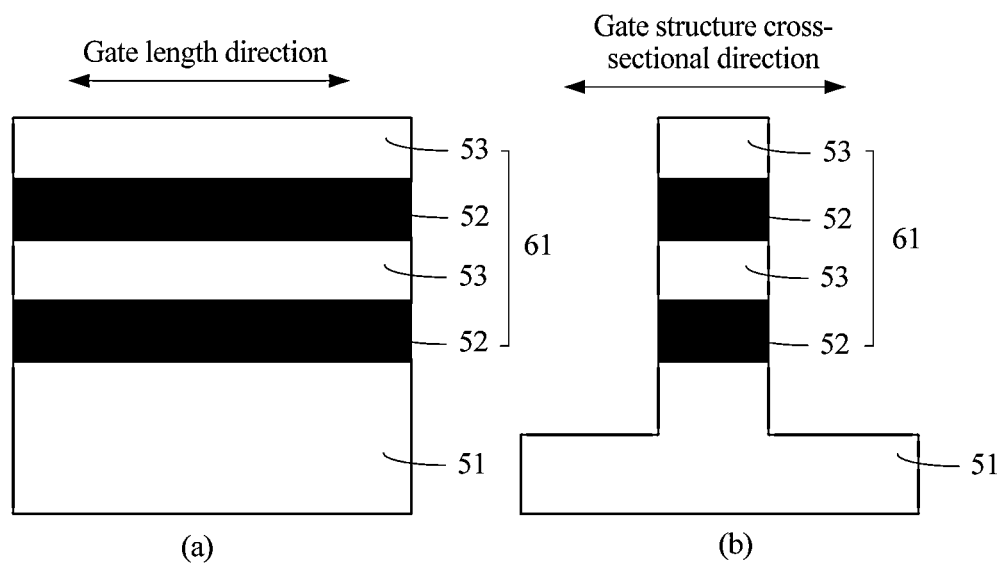
FIG. 6 is a schematic diagram 2 of a fabrication principle of a field-effect transistor according to an embodiment of the present invention.

Further, the superlattice structure including the first semiconductor material layer 52 and the second semiconductor material layer 53 may be etched to form a support structure 61 shown in FIG. 6. For example, the support structure 61 may be disposed on the semiconductor substrate 51 in a fin form. Herein, FIG. 6 (a) is a schematic cross-sectional view along a gate length direction, and FIG. 6 (b) is a schematic cross-sectional view along a gate structure cross-sectional direction.

Figure 7:
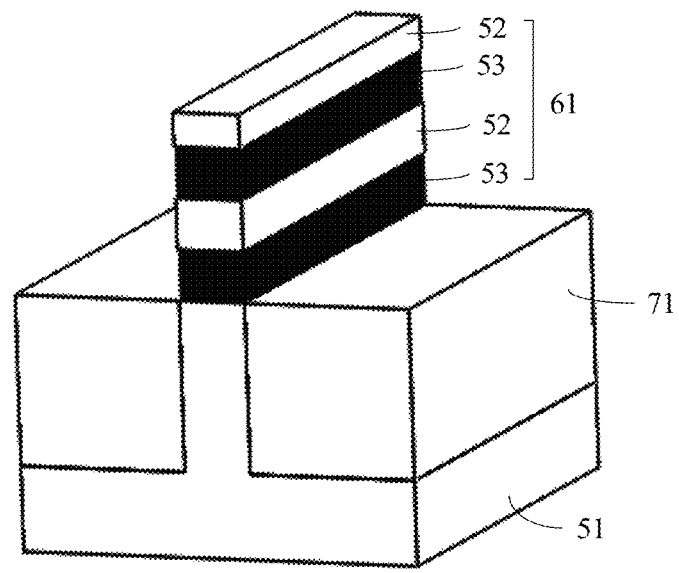
FIG. 7 is a schematic diagram 3 of a fabrication principle of a field-effect transistor according to an embodiment of the present invention.

Further, as shown in FIG. 7, an isolation layer 71 may be further formed on the two sides of the support structure 61 by using a CMP (chemical-mechanical polishing) process and a recess process.

Optionally, a thickness of the isolation layer 71 is the same as a thickness of the etched semiconductor substrate 51.

For example, the isolation layer 71 may be specifically made of an oxide such as silicon oxide. This is not limited in this embodiment of the present invention.

Block 402. Form, along a boundary between the isolation layer and the support structure, a dummy gate structure that covers the support structure, where a length of the dummy gate structure in a gate length direction is less than a length of the first semiconductor material layer in the gate length direction.

Figure 8:
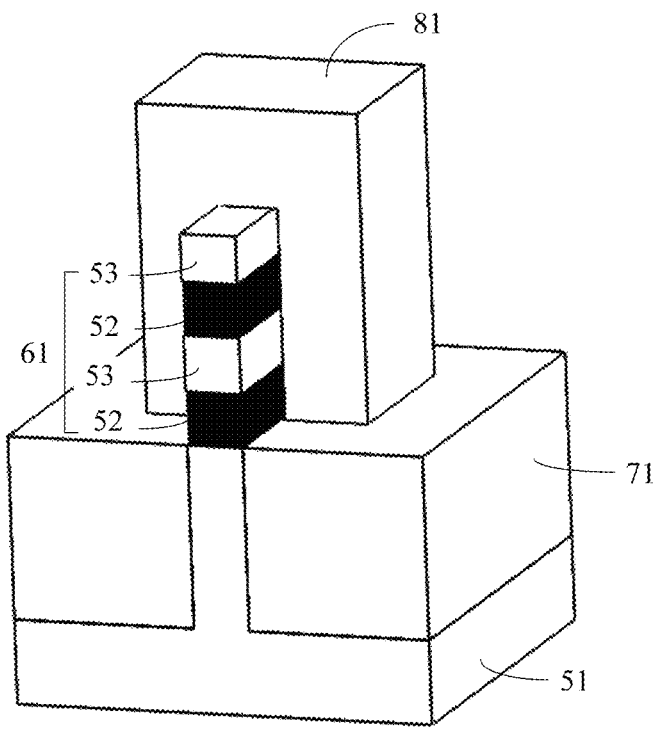
FIG. 8 is a schematic diagram 4 of a fabrication principle of a field-effect transistor according to an embodiment of the present invention.

As shown in FIG. 8, after the isolation layer 71 is formed, a dummy gate structure 81 that covers the support structure 61 may be further formed on the isolation layer 71. In this case, the support structure 61 is embedded in a gap formed between the isolation layer 71 and the dummy gate structure 81.

Figure 9:
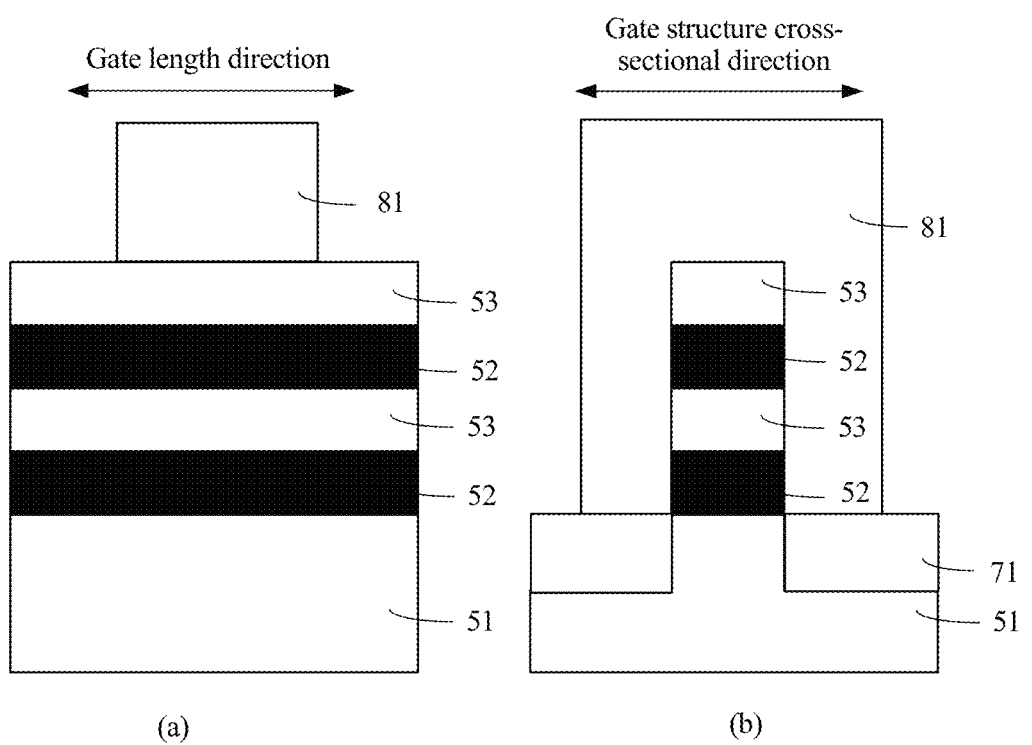
FIG. 9 is a schematic diagram 5 of a fabrication principle of a field-effect transistor according to an embodiment of the present invention.

As shown in FIG. 9 (a), a length of the dummy gate structure 81 in the gate length direction is less than a length of the first semiconductor material layer 52 in the gate length direction. Herein, FIG. 9 (a) is a schematic cross-sectional view along a gate length direction, and FIG. 9 (b) is a schematic cross-sectional view along a gate structure cross-sectional direction.

For example, the dummy gate structure 81 may be specifically made of a polycrystalline silicon material or an amorphous silicon material. This is not limited in this embodiment of the present invention.

Specifically, an oxide layer may be first formed on the exposed support structure 61, and then the dummy gate structure 81 that covers the support structure 61 may be formed on the oxide layer.

Figure 10:
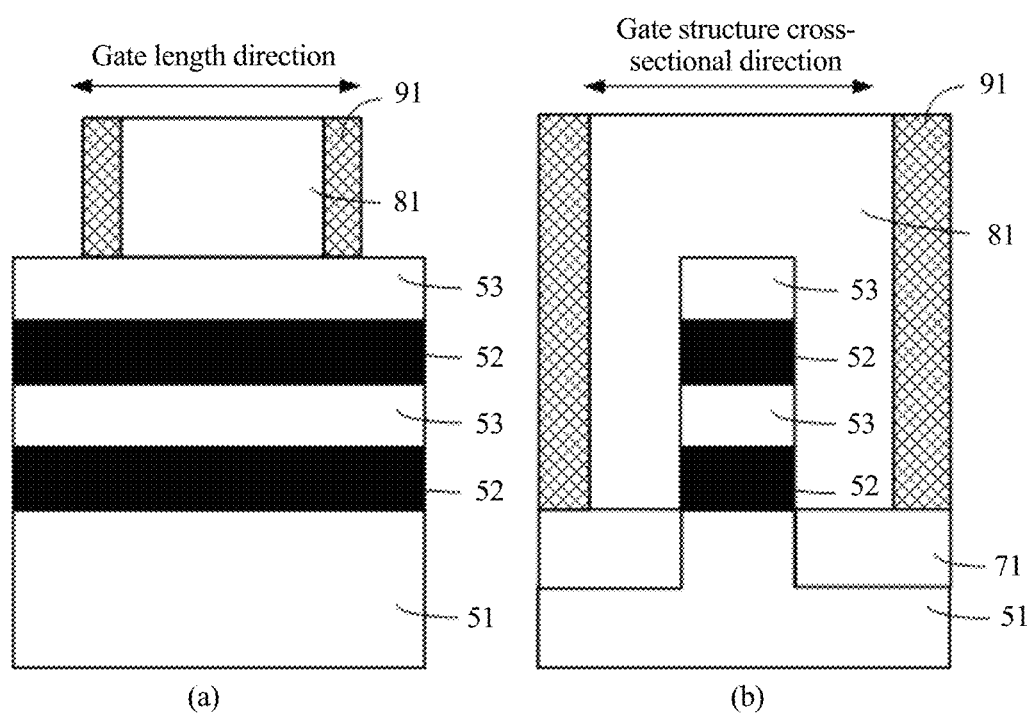
FIG. 10 is a schematic diagram 6 of a fabrication principle of a field-effect transistor according to an embodiment of the present invention.

Further, as shown in FIG. 10, an insulation layer 91 may be further deposited on a periphery of the dummy gate structure 81, so that a side wall of the insulation layer 91 is flush with a side wall of the isolation layer 71 in the gate structure cross-sectional direction. Herein, FIG. 10 (a) is a schematic cross-sectional view along a gate length direction, and FIG. 10 (b) is a schematic cross-sectional view along a gate structure cross-sectional direction.

In addition, when the dummy gate structure 81 is formed, etching anisotropy is ensured as much as possible, and an etching selection ratio of polycrystalline silicon and silicon oxide is adjusted to be as high as possible, to form the dummy gate structure 81 in a relatively steep shape. The dummy gate structure 81 in the relatively steep shape facilitates subsequent forming of the insulation layer 91. Therefore, the dummy gate structure 81 can well fit with the insulation layer 91, thereby ensuring that the dummy gate structure 81 is effectively isolated.

Block 403. Remove, along the gate length direction, an area other than a sacrificial layer in the first semiconductor material layer to form an insulation groove.

The foregoing sacrificial layer is a projection area of the dummy gate structure 81 in the first semiconductor material layer 52 along a target direction (the target direction is a direction perpendicular to a bottom of the semiconductor substrate 51, to be specific, an orthographic projection direction of the dummy gate structure 81 in the first semiconductor material layer 52).

A dielectric constant of a dielectric filled in the insulation groove is less than a dielectric constant of the first semiconductor material layer.

Figure 11:
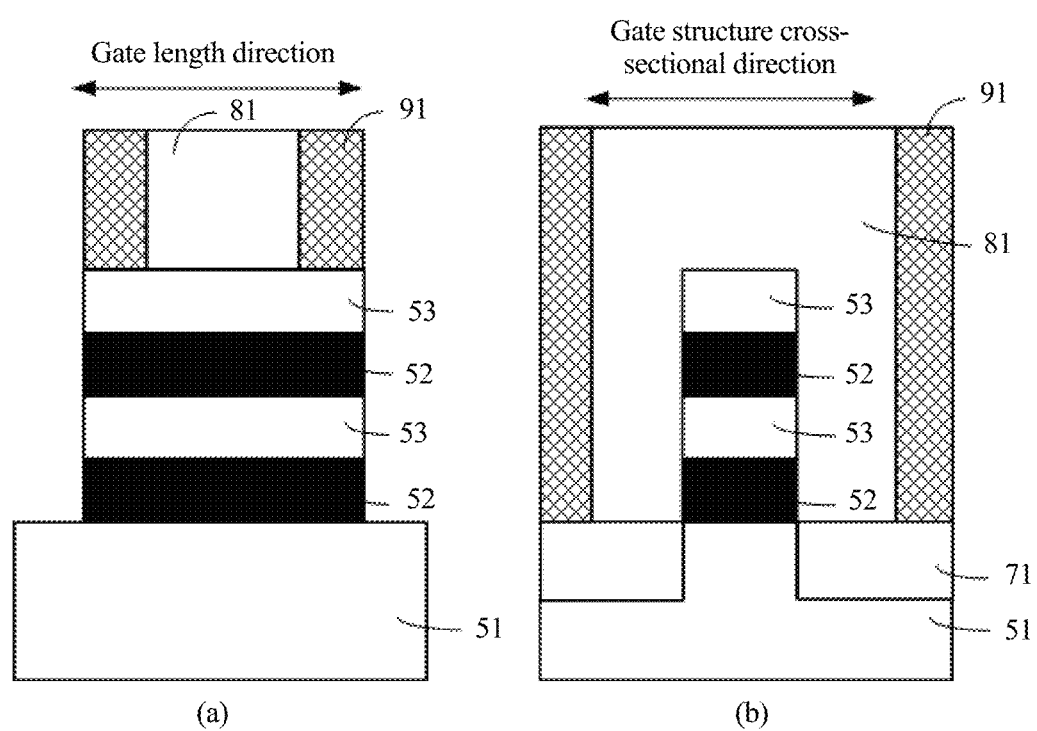
FIG. 11 is a schematic diagram 7 of a fabrication principle of a field-effect transistor according to an embodiment of the present invention.

In a possible design manner, the first semiconductor material layer 52 and the second semiconductor material layer 53 may be first etched along the side wall of the insulation layer 91 in the gate length direction, so that side walls of the first semiconductor material layer 52 and the second semiconductor material layer 53 are flush with the side wall of the insulation layer 91 (as shown in FIG. 11 (a)). Herein, FIG. 11 (a) is a schematic cross-sectional view along a gate length direction, and FIG. 11 (b) is a schematic cross-sectional view along a gate structure cross-sectional direction.

Figure 12:
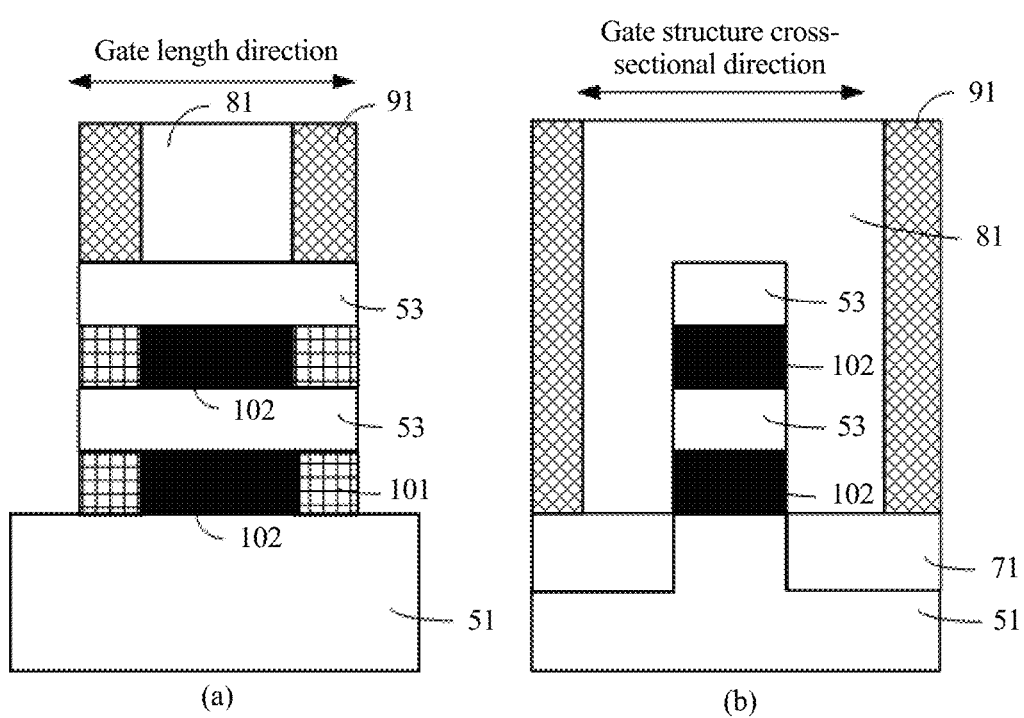
FIG. 12 is a schematic diagram 8 of a fabrication principle of a field-effect transistor according to an embodiment of the present invention.

Further, a selective oxidation (selective oxidation) process is performed on the first semiconductor material layer 52 shown in FIG. 11 (a). Therefore, in the first semiconductor material layer 52, the area other than the projection area of the dummy gate structure 81 in the first semiconductor material layer 52 is oxidized, and an oxidized part forms an insulation groove 101 shown in FIG. 12 (a); the projection area of the dummy gate structure 81 in the first semiconductor material layer 52 is not oxidized to form a sacrificial layer 102 shown in FIG. 12 (a). In this case, the insulation groove 101 is filled with an oxide (for example, silicon oxide) of the first semiconductor material layer 52, and the oxide of the first semiconductor material layer 52 usually has a relatively low dielectric constant. Therefore, the insulation groove 101 can isolate the subsequently formed source (or drain) from a gate material filled in the sacrificial layer 102, for example, a high-K (high dielectric constant) dielectric material, to avoid a parasitic capacitance generated after the subsequently formed source (or drain) is in direct contact with the gate formed by the gate material. Herein, FIG. 12 (a) is a schematic cross-sectional view along a gate length direction, and FIG. 12 (b) is a schematic cross-sectional view along a gate structure cross-sectional direction.

For example, when the first semiconductor material layer 52 is made of silicon, after the foregoing selective oxidation process is performed, silicon oxide is formed in the insulation groove 101. A dielectric constant of the silicon oxide is approximately 3.9, and a dielectric constant of silicon is approximately 11.5, which is far greater than the dielectric constant of the silicon oxide.

In another embodiment, a selective etching process may be performed on the first semiconductor material layer 52 shown in FIG. 11 (a) along the gate length direction. Therefore, in the first semiconductor material layer 52, the area other than the projection area of the dummy gate structure 81 in the first semiconductor material layer 52 is removed to form the insulation groove 101 shown in FIG. 13 (a); the projection area of the dummy gate structure 81 in the first semiconductor material layer 52 is retained to form the sacrificial layer 102 shown in FIG. 13 (a). In this case, the insulation groove 101 is filled with air. The air is a dielectric with a relatively low dielectric constant (a dielectric constant of the air is approximately 1). Therefore, the air can isolate the subsequently formed source (or drain) from the gate material filled in the sacrificial layer 102, to avoid a parasitic capacitance generated after the subsequently formed source (or drain) is in direct contact with the gate formed by the gate material. Herein, FIG. 13 (a) is a schematic cross-sectional view along a gate length direction, and FIG. 13 (b) is a schematic cross-sectional view along a gate structure cross-sectional direction.

Figure 13:
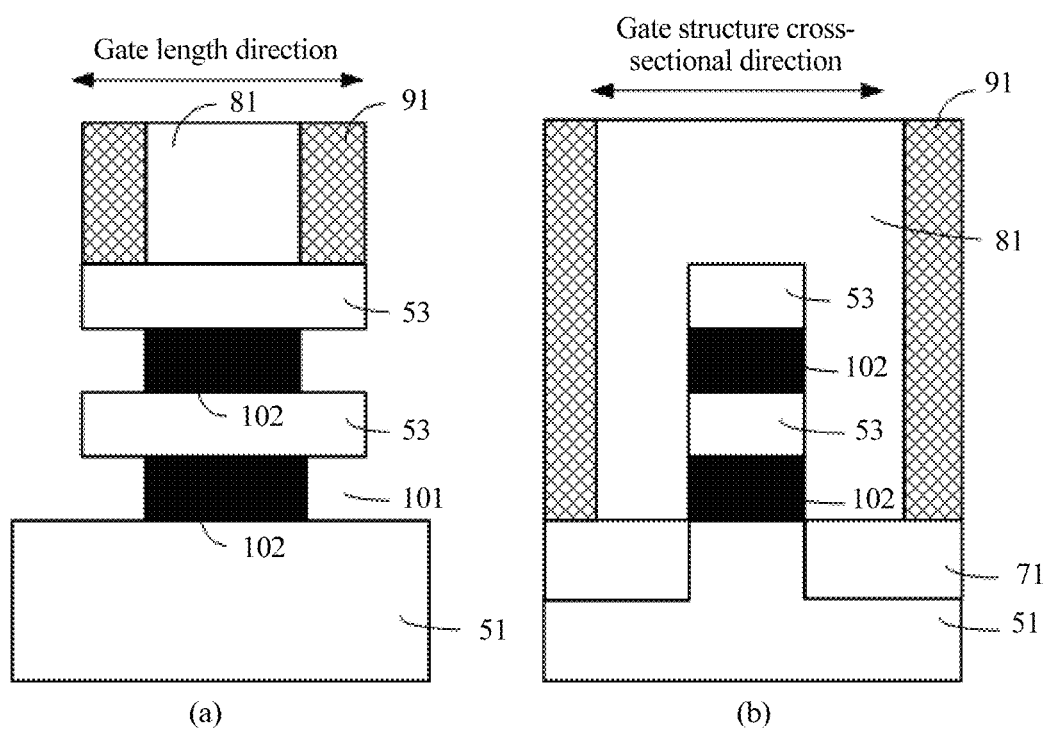
FIG. 13 is a schematic diagram 9 of a fabrication principle of a field-effect transistor according to an embodiment of the present invention.
Figure 14:
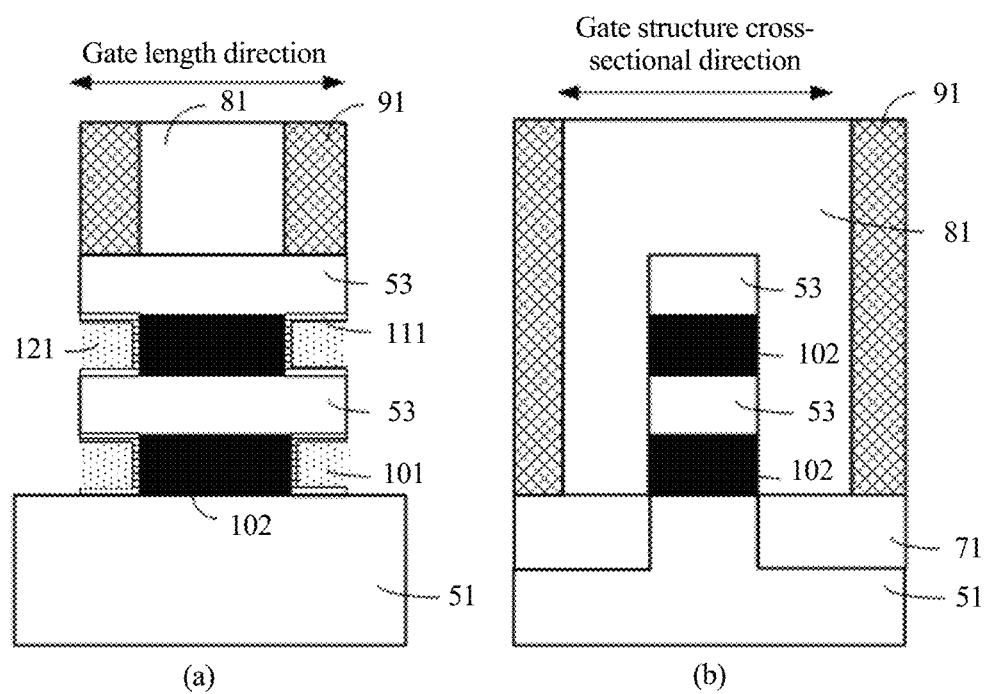
FIG. 14 is a schematic diagram 10 of a fabrication principle of a field-effect transistor according to an embodiment of the present invention.

In addition, after the insulation groove 101 shown in FIG. 13 (a) is formed, as shown in FIG. 14 (FIG. 14 (a) is a schematic cross-sectional view along a gate length direction, and FIG. 14 (b) is a schematic cross-sectional view along a gate structure cross-sectional direction), an etching stop layer 111 may be formed on a surface of the insulation groove 101 by using an ALD (atomic layer deposition) process. In this way, when the sacrificial layer 102 is subsequently removed, the etching stop layer 111 can prevent an etching solution from etching an area other than the sacrificial layer 102.

Further, still as shown in FIG. 14 (a), the insulation groove 101 may be filled with a dielectric material whose dielectric constant is less than 3.9, for example, a low-K (low dielectric constant) dielectric material 121, so that the insulation groove 101 has a lower K (dielectric constant) value, to avoid a parasitic capacitance generated after the subsequently formed source (or drain) is in direct contact with the gate formed by the gate material filled in the sacrificial layer 102.

Generally, a dielectric material whose dielectric constant is less than 2.5 may be used as a low-K dielectric material, for example, SiCOH (a hydrogenated silicon carbon oxide).

Similarly, a dielectric material whose dielectric constant is greater than 4 may be used as a high-K dielectric material, for example, $HfO_2$ (hafnium dioxide).

The dielectric constant ($\varepsilon$) described in this embodiment of the present invention is a product of a relative permittivity ($\varepsilon_r$) and an absolute vacuum permittivity ($\varepsilon_0$), to be specific, $\varepsilon = \varepsilon_r * \varepsilon_0$, where $\varepsilon_0 = 8.85*10^{-12}$ F/m.

For example, the dielectric constant of the first semiconductor material layer 52 or the second semiconductor material layer 53 is approximately 10 to 12.

Block 404. Form a source and a drain in a preset source drain area along the gate length direction, where the source and the drain are isolated from the sacrificial layer through the insulation groove.

In an example in which a low-K dielectric material 121 is filled in the insulation groove 101 shown in FIG. 14, in block 404, a material such as silicon or silicon germanium may epitaxially grow in a preset source drain area by using a selective epitaxy technology. Further, a doping process is used, so that the source drain area has a specified doping density, to form a source 131 and a drain 132 shown in FIG. 15 (FIG. 15 (a) is a schematic cross-sectional view along a gate length direction, and FIG. 15 (b) is a schematic cross-sectional view along a gate structure cross-sectional direction).

In this case, the source 131 and the drain 132 are isolated from the sacrificial layer 102 through the insulation groove 101. Subsequently, after the sacrificial layer 102 is removed, a high-K dielectric material may be filled at a location of the sacrificial layer 102 to form a gate. In this way, the source 131 and the drain 132 can still be isolated from the gate through the insulation groove 101, to reduce a parasitic capacitance generated when the source 131 and the drain 132 are in direct contact with the gate.

Figure 15:
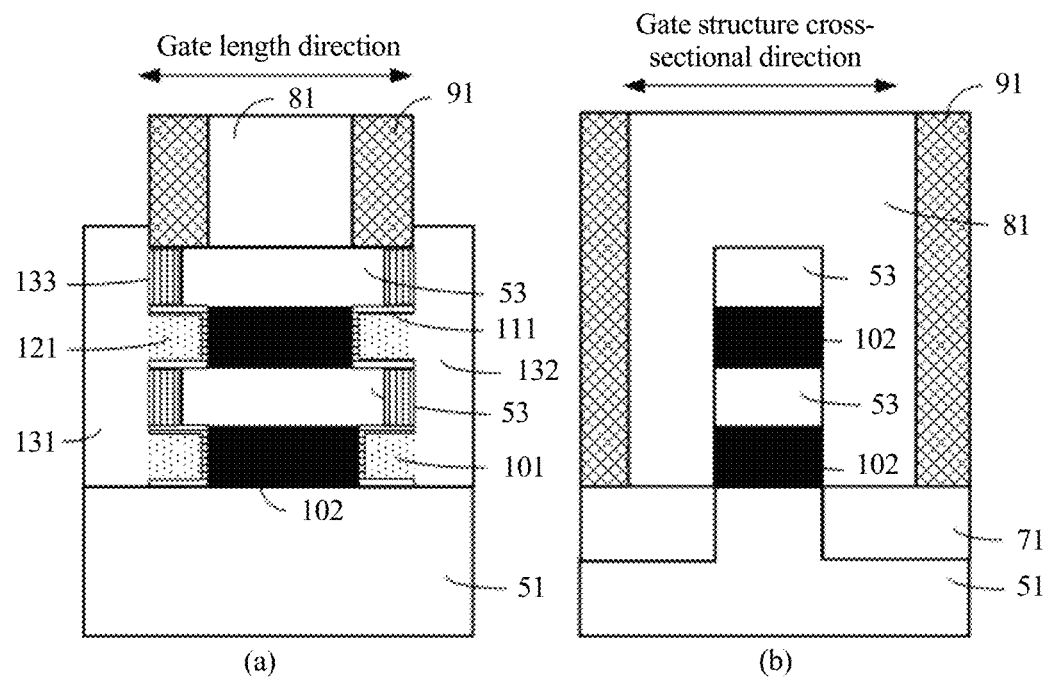
FIG. 15 is a schematic diagram 11 of a fabrication principle of a field-effect transistor according to an embodiment of the present invention.

In addition, still as shown in FIG. 15 (a), when the source 131 and the drain 132 are formed, an impurity atom diffuses into the second semiconductor material layer 53 to form an extension area 133. A size of the extension area is related to a parasitic resistance of a field-effect transistor. A larger extension area indicates a smaller value of the parasitic resistance, and a smaller extension area indicates a larger value of the parasitic resistance.

Therefore, to reduce the parasitic resistance, the thickness of the second semiconductor material layer 53 may be set as large as possible, to form a relatively large extension area. However, the larger thickness of the second semiconductor material layer 53 reduces a capability of the field-effect transistor to suppress a short-channel effect. For example, a leakage current of the field-effect transistor is increased. In this case, the foregoing problem may be resolved by using the following block 406.

Block 405. Remove the dummy gate structure and the sacrificial layer.

Figure 16:
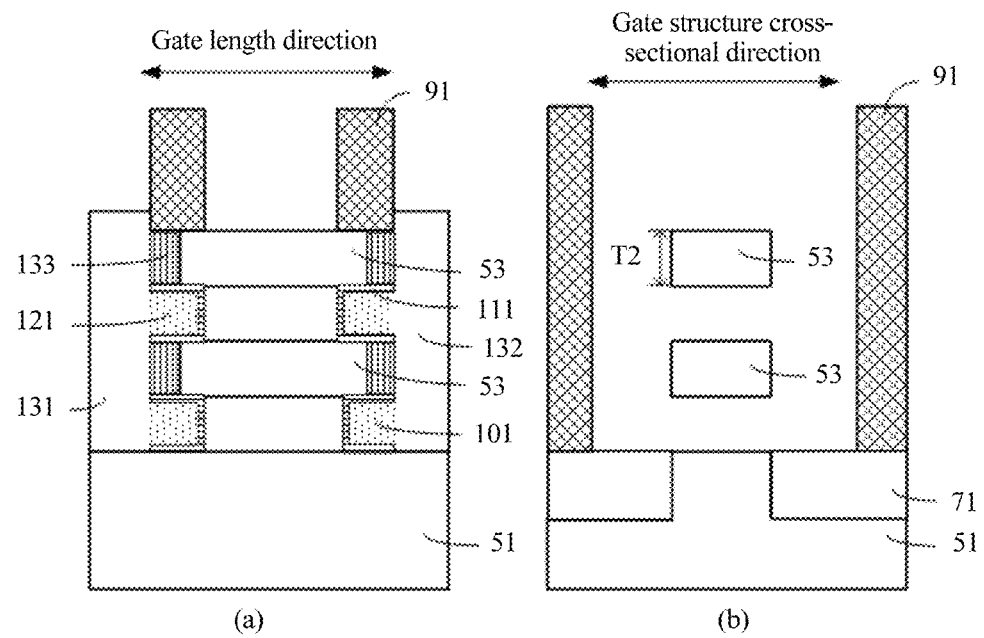
FIG. 16 is a schematic diagram 12 of a fabrication principle of a field-effect transistor according to an embodiment of the present invention.

As shown in FIG. 16 (FIG. 16 (a) is a schematic cross-sectional view along a gate length direction, and FIG. 16 (b) is a schematic cross-sectional view along a gate structure cross-sectional direction), the foregoing dummy gate structure 81 and the sacrificial layer 102 may be removed by using an etching process.

Block 406. Adjust a thickness of the second semiconductor material layer along a gate structure cross-sectional direction.

In step 406, as shown in FIG. 16 (b), the thickness of the second semiconductor material layer 53 in a channel area may be adjusted. For example, the thickness of the second semiconductor material layer 53 may be reduced from T1 of 8 nm to T2 of 4 nm through adjustment by using an etching process or the like. In this way, because the channel effect of the field-effect transistor is related to the thickness of the second semiconductor material layer 53, the short-channel effect of the field-effect transistor can be alleviated by adjusting the thickness of the second semiconductor material layer 53, so that the short-channel effect is flexibly adjusted without increasing a parasitic resistance.

Block 407. Form a gate at locations of the removed dummy gate structure and the removed sacrificial layer by using an RMG process.

Figure 17:
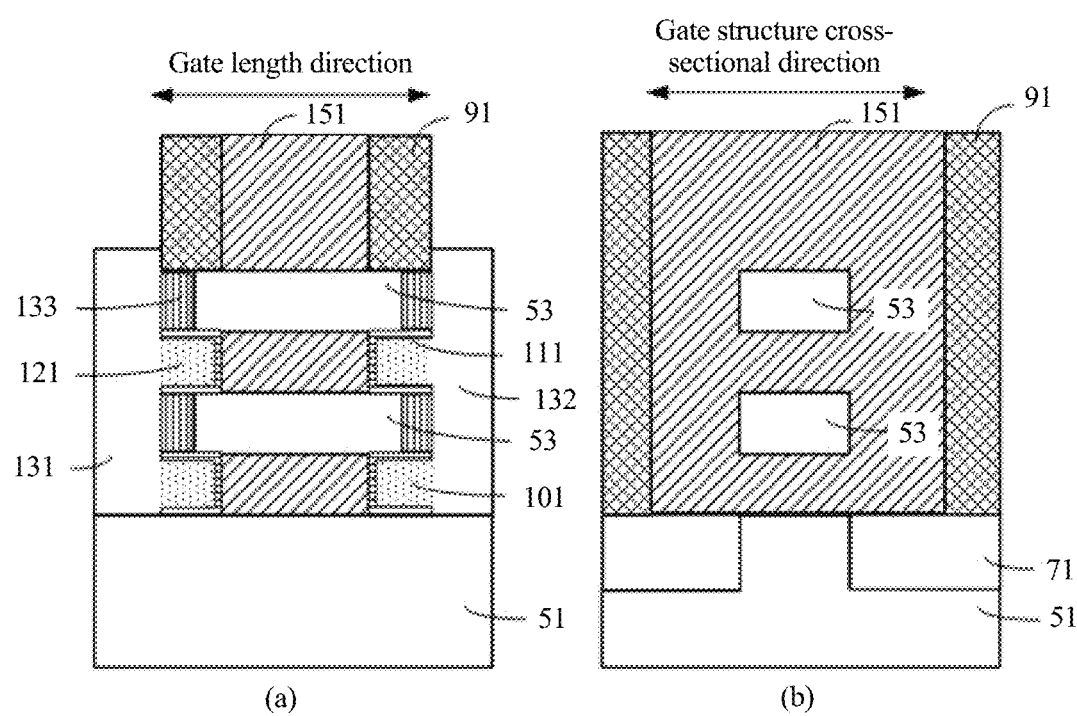
FIG. 17 is a schematic diagram 13 of a fabrication principle of a field-effect transistor according to an embodiment of the present invention.

Subsequently, based on the prior art, a gate 151 shown in FIG. 17 (the gate 151 includes a structure of at least two layers, where one layer is made of a high-K dielectric material, and the other layer is made of a metal material with a specific work function) may be formed at locations of the removed dummy gate structure 81 and the removed sacrificial layer 102 by using an RMG (replacement metal gate) process, to finally form a field-effect transistor. FIG. 17 (a) is a schematic cross-sectional view along a gate length direction, and FIG. 17 (b) is a schematic cross-sectional view along a gate structure cross-sectional direction.

As shown in FIG. 17, in the formed field-effect transistor, the location at which the first semiconductor material layer 51 is originally disposed in the gate 151 may be isolated from the source 131 (or the drain 132) by using a material with a relatively low dielectric constant in the insulation groove 101; the location at which the dummy gate structure 81 is originally disposed in the gate 151 may be isolated from the source 131 (or the drain 132) by using the insulation layer 91. In other words, the gate 151 is almost completely isolated from the source 131 (or the drain 132) through the insulation groove 101 and the insulation layer 91, to reduce a parasitic capacitance of the entire field-effect transistor, thereby improving performance and reliability of the field-effect transistor.

In addition, an embodiment of the present invention further provides a field-effect transistor. The field-effect transistor may be a MOSFET, a tunneling field-effect transistor, or the like. This is not limited in this embodiment of the present invention.

For a fabrication method of a field-effect transistor further provided in an embodiment of the present invention, refer to related content of blocks 401 to 407 in the foregoing embodiment. Therefore, details are not described herein again.

For example, as shown in FIG. 17 (a), in the field-effect transistor provided in this embodiment of the present invention, the gate 151 is disposed in a channel formed between the source 131 and the drain 132, and the gate 151 is not in direct contact with the source 131 (or the drain 132) but is isolated from the source 131 (or the drain 132) through the insulation groove 101. The insulation groove 101 is filled with a material with a relatively low dielectric constant. Therefore, a parasitic capacitance generated when the gate 151 is in direct contact with the source 131 (or the drain 132) can be avoided, and performance and reliability of the field-effect transistor can be improved.

The embodiments of the present invention provide the field-effect transistor and the fabrication method of the field-effect transistor. The fabrication method includes: first forming a support structure with a superlattice feature on a semiconductor substrate, where the support structure includes a first semiconductor material layer and a second semiconductor material layer that are alternately disposed, and an isolation layer is disposed on two sides of the support structure; further forming, on the isolation layer, a dummy gate structure that covers the support structure, where a length of the dummy gate structure in a gate length direction is less than a length of the first semiconductor material layer in the gate length direction; removing, along the gate length direction, an area other than a sacrificial layer in the first semiconductor material layer to form an insulation groove, where the insulation groove is formed in the area other than the sacrificial layer in the first semiconductor material layer, and the sacrificial layer is a projection area of the dummy gate structure in the first semiconductor material layer along a target direction (to be specific, a direction perpendicular to a surface of the isolation layer in which the support structure is disposed), and a dielectric constant of a dielectric filled in the insulation groove is less than a dielectric constant of the first semiconductor material layer; and forming a source and a drain in a preset source drain area along the gate length direction, where the source and the drain may be isolated, through the insulation groove, from a gate material (for example, a high-K dielectric material) filled in the sacrificial layer. Therefore, a parasitic capacitance generated when the source (or the drain) is in direct contact with the gate material can be avoided, a parasitic capacitance of the entire field-effect transistor can be reduced, and performance and reliability of the field-effect transistor can be improved.

A person skilled in the art should be aware that in one or more of the foregoing examples, the functions described in the present invention may be implemented by using hardware, software, firmware, or any combination thereof. When the functions are implemented by software, these functions may be stored in a computer readable medium or transmitted as one or more instructions or code in the computer readable medium. The computer readable medium includes a computer storage medium and a communications medium, where the communications medium includes any medium that enables a computer program to be transmitted from one place to another. The storage medium may be any available medium accessible to a general-purpose or dedicated computer.

The objectives, technical solutions, and beneficial effects of the present invention are further described in detail in the foregoing specific embodiments. It should be understood that the foregoing descriptions are merely specific embodiments of the present invention, but are not intended to limit the protection scope of the present invention. Any modification, equivalent replacement, or improvement made based on the technical solutions of the present invention shall fall within the protection scope of the present invention.

What is claimed is:

1. A fabrication method of a field-effect transistor, comprising:
    forming a support structure with a superlattice feature on a semiconductor substrate, wherein the support structure comprises a first semiconductor material layer and a second semiconductor material layer that are alternately disposed, and an isolation layer is disposed on two sides of the support structure;
    forming, along a boundary between the isolation layer and the support structure, a dummy gate structure that covers the support structure, wherein a length of the dummy gate structure in a gate length direction is less than a length of the first semiconductor material layer in the gate length direction, and the gate length direction indicates a transport direction of a carrier in the field-effect transistor;
    removing, along the gate length direction, an area other than a sacrificial layer in the first semiconductor material layer to form an insulation groove, and, forming, along the gate length direction, an etching stop layer on a surface of the insulation groove by using an atomic layer deposition (ALD) process, wherein the sacrificial layer is a projection area of the dummy gate structure in the first semiconductor material layer along a target direction, the insulation groove is filled by gas whose dielectric constant is less than 3.9, and wherein the target direction is a direction perpendicular to a bottom of the semiconductor substrate;
    forming a source and a drain in a preset source drain area along the gate length direction, wherein the source and the drain are isolated from the sacrificial layer through the insulation groove; and
    removing the dummy gate structure and the sacrificial layer,
    wherein the removing of the area other than a sacrificial layer in the first semiconductor material layer to form the insulation groove comprises:
    performing, along the gate length direction, a selective etching process on the first semiconductor material layer, so that the area other than the sacrificial layer in the first semiconductor material layer is removed to form the insulation groove.

2. The fabrication method according to claim 1, wherein the forming of the support structure with the superlattice feature on the semiconductor substrate comprises:
    growing a periodic superlattice structure comprising the first semiconductor material layer and the second semiconductor material layer that are alternately disposed on the semiconductor substrate, wherein a thickness of the first semiconductor material layer and a thickness of the second semiconductor material layer are both less than 50 nm; and
    etching the superlattice structure to form a fin support structure.

3. The fabrication method according to claim 1, wherein the forming of the dummy gate structure that covers the support structure comprises:
    forming an oxide layer on the support structure; and
    forming, on the oxide layer, the dummy gate structure that covers the support structure.

4. The fabrication method according to claim 1, wherein a length of the dummy gate structure in a gate structure cross-sectional direction is less than a length of the isolation layer, wherein the gate structure cross-sectional direction is perpendicular to the gate length direction; and
    after the dummy gate structure that covers the support structure is formed on the isolation layer, the fabrication method further comprises:
    depositing an insulation layer on a periphery of the dummy gate structure, wherein a side wall of the insulation layer is flush with a side wall of the isolation layer.

5. The fabrication method according to claim 1, wherein the gas is air.

6. The fabrication method according to claim 1, further comprises:
    adjusting a thickness of the second semiconductor material layer along a gate structure cross-sectional direction, wherein the gate structure cross-sectional direction is perpendicular to the gate length direction.

7. The fabrication method according to claim 6, further comprising:
    after the adjusting a thickness of the second semiconductor material layer along a gate structure cross-sectional direction, forming a gate at locations of the removed dummy gate structure and the removed sacrificial layer by using a replacement metal gate (RMG) process.

8. The fabrication method of claim 1, wherein the semiconductor substrate is one of a silicon-on-insulator (SOI) substrate, a bulk silicon substrate, an extremely thin SOI (ETSOI) substrate, an SiGe-on-insulator (SGOI) substrate, an III-V-on-insulator (III-V-OI) substrate.

9. The fabrication method of claim 1, wherein the support structure is embedded in a gap formed between the isolation layer and the dummy gate structure.

10. The fabrication method of claim 9, wherein the dummy gate structure is made of a polycrystalline silicon material or an amorphous silicon material.

11. A field-effect transistor, comprising:
    a source and a drain; and
    a stack structure, wherein the stack structure is disposed between the source and the drain, and a gate is alternatively disposed with a semiconductor material layer in the stack structure;
    wherein the gate is isolated from the source and the drain through an insulation groove, the insulation groove is filled by gas,
    the semiconductor material layer comprises two extension areas and a channel area, with a central part in the channel area, and two ends in the two extension areas, a thickness of the channel area along a gate structure cross-sectional direction is smaller than a thickness of the two extension areas, the two extension areas are formed by diffusion of an impurity atom from the source and the drain.

12. The field-effect transistor of claim 11, wherein a dielectric constant of the gas in the insulation groove is less than 3.9.

13. The field-effect transistor of claim 11, wherein a surface of the insulation groove comprises an etching stop layer.

14. The field-effect transistor of claim 11, wherein a thickness of the semiconductor material layer is less than 50 nm.

15. The field-effect transistor of claim 11, wherein an isolation layer is disposed on two sides of the gate in a cross-sectional direction, wherein the cross-sectional direction is perpendicular to a gate length direction of the gate.

16. The field-effect transistor of claim 15, wherein a length of the gate in the cross-sectional direction is less than a length of the isolation layer.

17. The field-effect transistor of claim 11, wherein the gas is air.

18. The field-effect transistor of claim 11, wherein the channel area is formed between the source and the drain.

19. The field-effect transistor of claim 11, wherein the gate includes a structure of at least two layers, where one layer is made of a high-K dielectric material, and the other layer is made of a metal material.

* * * * *